(12) United States Patent
Dege et al.

(10) Patent No.: US 10,864,978 B2
(45) Date of Patent: Dec. 15, 2020

(54) METHOD FOR OPERATING AN AIRCRAFT COMPRISING A WING WITH A FOLDABLE WING TIP PORTION

(71) Applicant: Airbus Operations GmbH, Hamburg (DE)

(72) Inventors: Saskia Dege, Hamburg (DE); Svenja Jegminat, Hamburg (DE); Jörg Wyrembek, Hamburg (DE)

(73) Assignee: Airbus Operations GmbH, Hamburg (DE)

( * ) Notice: Subject to any disclaimer, the term of this patent is extended or adjusted under 35 U.S.C. 154(b) by 92 days.

(21) Appl. No.: 16/193,239

(22) Filed: Nov. 16, 2018

(65) Prior Publication Data

US 2019/0152578 A1    May 23, 2019

(30) Foreign Application Priority Data

Nov. 17, 2017   (DE) ........................ 10 2017 127 194

(51) Int. Cl.
*G01C 23/00*   (2006.01)
*B64C 3/54*    (2006.01)
(Continued)

(52) U.S. Cl.
CPC ................ *B64C 3/546* (2013.01); *B64C 3/56* (2013.01); *B64D 45/0005* (2013.01);
(Continued)

(58) Field of Classification Search
CPC ........... B64C 3/546; B64C 3/56; G06F 30/20; B64D 45/0005
See application file for complete search history.

(56) References Cited

U.S. PATENT DOCUMENTS 5,381,986 A    1/1995  Smith et al.
9,499,252 B2   11/2016 Lassen et al.
(Continued)

FOREIGN PATENT DOCUMENTS

EP    2 026 158    2/2009
EP    2 727 829    5/2014
(Continued)

OTHER PUBLICATIONS

European Search Report cited in EP 18 20 6434 dated Feb. 18, 2019, 9 pages.
(Continued)

*Primary Examiner* — Adam M Alharbi
(74) *Attorney, Agent, or Firm* — Nixon & Vanderhye P.C.

(57) ABSTRACT

A method to detect a failure of a sensor or system in an aircraft, wherein the aircraft includes a wing including a fixed wing and a wing tip device pivotably mounted to the fixed wing, a sensor system, and a control unit including a system behavior model which models a target vale of an operation parameter of the wing, wherein the method includes: detecting a value of an operation parameter by the sensor system; comparing the detected value of the operation parameter to a corresponding target value of the operation parameter obtained from the system behavior model, and declaring a sensor failure or a system failure in response to determining a predefined deviation of the detected value from the corresponding target value of the operation parameter, detecting a sensor failure or a system failure.

15 Claims, 1 Drawing Sheet

(51) Int. Cl.
    *B64D 45/00*     (2006.01)
    *B64C 3/56*     (2006.01)
    *G06F 30/20*     (2020.01)
    *G07C 5/08*     (2006.01)

(52) U.S. Cl.
    CPC ........... *G06F 30/20* (2020.01); *G07C 5/0808* (2013.01); *B64D 2045/0085* (2013.01)

(56) References Cited

U.S. PATENT DOCUMENTS

| | | | |
|---|---|---|---|
| 10,147,244 B2 * | 12/2018 | Atalla | B64D 43/00 |
| 2005/0069207 A1 * | 3/2005 | Zakrzewski | G06K 9/629 |
| | | | 382/190 |
| 2013/0026287 A1 | 1/2013 | Goupil et al. | |
| 2014/0014768 A1 | 1/2014 | Lassen et al. | |

FOREIGN PATENT DOCUMENTS

| | | |
|---|---|---|
| EP | 3 018 053 | 5/2016 |
| EP | 3 093 233 | 11/2016 |
| EP | 3 254 958 | 12/2017 |

OTHER PUBLICATIONS

Search Report for DE 10 2017 127 194.5, dated Sep. 4, 2018, 5 pages.

* cited by examiner

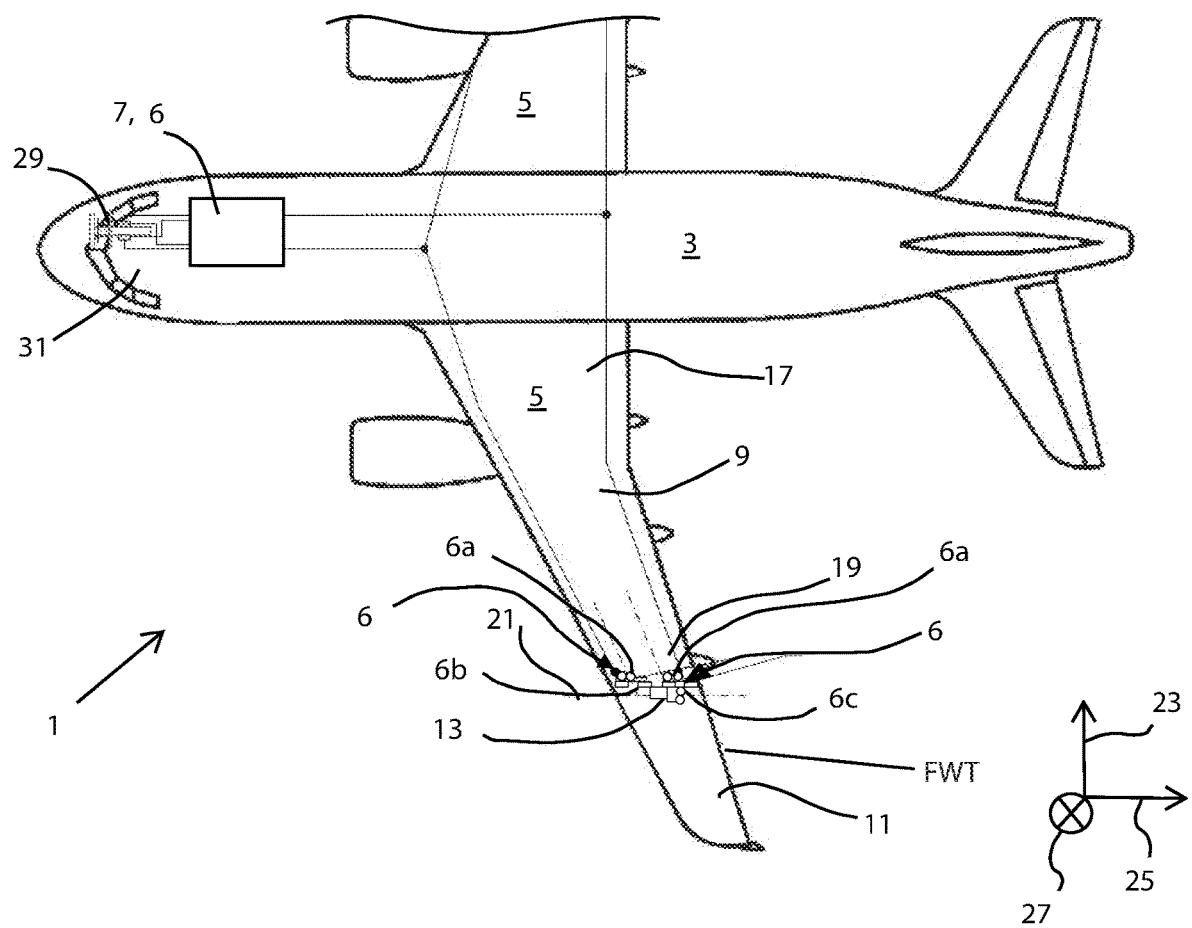

METHOD FOR OPERATING AN AIRCRAFT COMPRISING A WING WITH A FOLDABLE WING TIP PORTION

RELATED APPLICATION

This application claims priority to German Patent Application No. 10 2017 127 194.5 filed 17 Nov. 2017, the entirety of which is incorporated by reference.

FIELD

The present invention relates to a method for operating an aircraft having a wing with a foldable wing tip portion, and in particular to monitoring operation parameters related to the operation of the foldable wing tip portion.

BACKGROUND

Foldable wings include a fixed wing and a foldable wing tip portion mounted to the fixed wing in a foldable manner to pivot either upwards or sideways, or rearwards. To be folded upwards, the foldable wing tip portion may pivot about an axis extending in a horizontal plane and/or in parallel to a wing chord direction and/or in parallel to the wing surface and/or in a fight direction. To be folded sideways, the foldable wing tip portion may pivot about a vertical axis and/or about an axis parallel to a wing thickness direction and/or about an axis normal to a plane spanned by the wing chord direction and a wing span direction.

Foldable wings reduce the space requirements of an aircraft during maneuver and parking on ground. During flight the foldable wing tip portions are locked in an extended position such that the wing has a maximum span. After aircraft lands, the foldable wing tip portions are folded to reduce the span of the aircraft.

An actuation unit moves the foldable wing tip portions between extended and folded positions. An arresting unit locks the foldable wing tip portions in the extended position and/or in the folded position arresting unit is provided.

For correct operation of the foldable wing tip portion and of the actuation unit and the arresting unit, specific operation parameters related to the operation of the foldable wing tip portion have to be monitored in a reliable way. Monitoring of these operation parameters is used to detect failures in the actuation unit and arresting unit, and to enhance the maintenance of these units. Monitoring is usually done by redundant sensors and by associated monitors provided in the aircraft's cockpit for pilots or provided external to the aircraft for maintenance personnel. Redundant sensors and monitors add to the complexity and weight of the monitoring system.

SUMMARY

There is a long felt need to improve and simplify monitoring of the operation of the foldable wing tip device. The inventive method disclosed herein may be used to enhance the monitoring of the operation of a foldable wing tip device.

The method may be embodied by the following steps:

First, an aircraft is provided. The aircraft comprises a fuselage, wings mounted to the fuselage, a sensor system, and a control unit. Each wing comprises a fixed wing, a foldable wing tip portion, an actuation unit and an arresting unit. The fixed wing extends between a root end and a tip end. The foldable wing tip portion is mounted to the tip end of the fixed wing pivotally about an axis of rotation between an extended position, i.e. a flight position, and a folded position, i.e. a ground position. In the extended position the foldable wing tip portion extends in the wing span direction as an extension of the fixed wing. In the folded position the foldable wing tip portion is folded away and extends under an angle with respect to the wing span direction. The axis of rotation may extend in a wing chord direction or in a wing thickness direction. The actuation unit may include a motor, e.g. an electric motor combined with a gear box, and is configured for actuating movement of the foldable wing tip portion between the extended position and the folded position. The arresting unit is configured for locking the foldable wing tip portion in the extended position and/or in the folded position. The arresting unit may carry the load applied by air flowing over the foldable wing tip portion during flight.

The sensor system is configured for detecting an operation parameter(s) related to, such as directly related to, the operation of the foldable wing tip portion, and specifically related to the movement of the foldable wing tip portion between the extended and folded positions and to locking of the foldable wing tip portion in the extended or folded position. The sensor system may include a plurality of sensors configured to detect a plurality of operation parameters.

The control unit may include a processor executing software instructions stored in a non-transitory memory. The software instructions may include software applications for running and analyzing models, such as a system behavior model, of a structure such as the joint between a wing tip portion and a fixed wing, and the movement of the wing tip portion with respect to the fixed wing. The system behavior model may accept inputs of values of operation parameters and output predicted values of conditions of the wing tip portion, the fixed wing, and/or the joint between the two, the actuation unit and the arresting unit.

The system behavior model may include multiple system behavior models for multiple operation parameters. Each system behavior model may be an algorithm or look-up table for relating operation parameter(s) to predicted parameter(s) (also referred to as target value(s)) of the system being modeled. The one or more system behavior models relate to fully or partly verified numerical models that might be stored, such as in a database in a memory of the control unit, configured to be executed or processed by the control unit. The system behavior model provides, such as by listing or calculating, a target value of the operation parameter. The target value might also relate to a range of values. The system behavior model might also provide multiple target values, such as in the form of a curve of target values. This means, the system behavior model reflects or simulates the desired behavior of the operation parameter.

As a next step, a value of the operation parameter is detected by the sensor system. Multiple values of the operation parameter may be detected, and represented as a curve of values.

Subsequently, the detected value or values of the operation parameter is compared to the corresponding target value or values of the operation parameter from the system behavior model, such as by the control unit. For example, a curve of detected values is compared to a curve of corresponding target values.

Upon a predefined deviation of the detected value or values from the corresponding target value or values of the operation parameter, a sensor failure or a system failure is detected, such as being assigned or indicated, such as by the control unit. A system failure might relate to a failure of the actuation unit or of the arresting unit, but might also relate to a failure within the control unit or wiring or even within the connection mechanism that couples the foldable wing tip portion to the fixed wing. The sensor failure or system failure may then processed, e.g. by proceeding with predefined safety measures, such as deactivating sensor or system parts or outputting warning signals.

In this way, proper operation of the foldable wing tip portion can be monitored in a simple and reliable way, and the number of sensors and displays related to the foldable wing tip portion can be reduced.

The control unit may include multiple system behavior models for multiple operation parameters. The control unit may comprise one or more system behavior models associated with each of the multiple parameters, or the control unit might comprise multiple system behavior models associated with each of the multiple parameters. The multiple system behavior models may be stored in a database, such as in a non-transitory memory of the control unit, so that the database may be accessed or processed by the control unit. The database may include a variety of system behavior models for all relevant operation parameters and all relevant situations. The database may include system behavior models for the foldable wing tip portion to be used to monitor the operation of the foldable wing tip portion in a continuous and complete manner.

An exemplary operation parameter relates to a time period of an actuation cycle. An actuation cycle is defined as the length of time it takes the actuation unit to move the foldable wing tip portion from the folded position to the extended position, or vice versa. The time period of an actuation cycle reflects a very simple operation parameter that can be precisely monitored with a simple model.

The time period of the actuation cycle may start with an actuation command and end when the wing tip portion reaches a certain position, such as the fully extended or fully folded position. The actuation command may be detected by the control unit itself when starting the command, while reaching of the desired position may be detected by reading out a position sensor of the foldable wing tip portion. Such trigger points are specifically simple and reliable. However, other trigger points for the actuation cycle are also conceivable.

Alternatively, the time period of the actuation cycle may start with the actuation command and end with the locking of the foldable wing tip portion in a certain position by the arresting unit. The actuation command may be detected by the control unit itself when starting the command, while locking the foldable wing tip portion in the desired position may be detected by reading out a position sensor of the arresting unit, in particular a position sensor detecting a position of a latching device of the arresting unit, or of a locking device of the arresting unit, securing the latching device in the latched position. Such trigger points are specifically simple and reliable. However, other trigger points for the actuation cycle may be used.

Another operation parameter relates to the position of the foldable wing tip portion, such as at a predefined time or time period. The position of the foldable wing tip portion may be detected by reading a position sensor of the foldable wing tip portion. The time period of an actuation cycle represents another relevant operation parameter.

Another operation parameter is the speed, such as the rate of turning or pivoting, of the foldable wing tip portion during movement between extended and folded positions, such as at a predefined time or over a certain time period. The speed of the foldable wing tip portion may be detected by reading a speed sensor of the actuation unit. The speed of the foldable wing tip portion represents another relevant operation parameter.

Another operation parameter is the torque applied by the actuation unit, such as at a predefined time or during a certain time period. The torque applied by the actuation unit may be detected by reading out a torque sensor of the actuation unit. The torque applied by the actuation unit represents another relevant operation parameter.

At least one system behavior model may include an algorithm calculating the target value of an operation parameter in dependence of one or more other parameters detected (measured) by the sensor system. For example, the system behavior model may reflect or produce a curve of target values or any other linear or nonlinear course of target values. By using an algorithm, an operation parameter(s) can be simulated based on their relationship to other parameters detected (measured) by sensor. The behavior models, but predicting operation parameter(s), allow for complex and reliable simulation of a wing tip portion. Simple, reliable and fully validated system behavior model are incorporated into the active system to supplement sensors and monitors to ease monitoring, while more complex models can be used to run in the background for predictive maintenance.

Other parameters may be directly related to operation of the foldable wing tip portion, and/or might be external parameters, such as those not directly related to operation of the foldable wing tip portion. Other operation parameters may be the time period of an actuation cycle, the position of the foldable wing tip portion, the speed of the foldable wing tip portion, the torque applied by the actuation unit, etc. The other operation parameters might be detected by sensors of the sensor system, or might be simulated by system behavior models themselves. External parameters may be external loads, such as external torque measured between the foldable wing tip portion and the fixed wing during actuation, or temperature, specifically ambient temperature during operation of the foldable wing tip portion. Considering external parameters for simulating the operation parameters provides a more significant simulation based on other operation parameters, or allows for a simulation without considering other operation parameters at all and may be based only on external parameters.

The system behavior model may be embodied in a computer simulation of the target values of the one or more operation parameters during an actuation cycle, such as while the actuation unit moves the foldable wing tip portion from the folded position to the extended position, or vice versa, or during a locking cycle, such as while the arresting unit locks or unlocks the foldable wing tip portion in the folded position or in the extended position. The computer simulation account for one or more of the following operation parameters and external parameters: the time period of an actuation cycle, the position of the foldable wing tip portion, the speed of the foldable wing tip portion, the torque applied by the actuation unit, external loads, such as external torque detected between the foldable wing tip portion and the fixed wing during actuation, and temperature. In such a way, a reliable computer simulation of the operation parameter can be performed that can be used as reference for monitoring the operation parameter.

Upon detection of a sensor failure or a system failure, a warning signal may be put out by the control unit, such as a warning display, e.g. provided in the cockpit or at maintenance equipment. In such a way, the pilot or another responsible person can be warned of the sensor or system failure.

Upon detection of a sensor failure, the respective sensor may be deactivated. The failing sensor can thus no longer deliver incorrect values of the operation parameter.

Upon detection of a system failure, the respective system may be stopped, operated in a specific safe mode, and/or is deactivated, depending on the kind of failure detected and depending on the kind of system. The respective system might be the actuation unit, the arresting unit, the control unit or parts of the control unit, such as a computer or wiring, or might be the connection mechanism that couples the foldable wing tip portion to the fixed wing. In such a way, a safe procedure is provided for the case of a system failure.

A further aspect of the present invention relates to an aircraft comprising a fuselage, wings mounted to the fuselage, a sensor system, and a control unit. Each wing comprises a fixed wing, a foldable wing tip portion, an actuation unit, and an arresting unit. The foldable wing tip portion is mounted to the fixed wing pivotally about an axis of rotation between an extended position and a folded position. The actuation unit is configured for actuating movement of the foldable wing tip portion between the extended position and the folded position. The arresting unit is configured for locking the foldable wing tip portion in the extended position and/or in the folded position. The sensor system is configured for detecting an operation parameter related to the operation of the foldable wing tip portion. The control unit comprises a system behavior model with respect to the operation parameter, wherein the system behavior model provides a target value of the operation parameter. The control unit is configured for carrying out the method according to any of the afore-described embodiments. In particular, the control unit is configured for a) comparing a detected value of the operation parameter detected by the sensor system to a corresponding target value of the operation parameter from the system behavior model, and b) upon a predefined deviation of the detected value from the corresponding target value of the operation parameter, detecting a sensor failure or a system failure. Upon detection of a system or sensor failure, the control unit is configured to initiate the required reaction, such as deactivation of sensors or systems, or failure annunciation. The features, embodiments and effects explained above in connection with the method apply vis-à-vis for the aircraft.

SUMMARY OF DRAWINGS

An embodiment of the present invention is illustrated in FIG. 1 which shows a top view of an aircraft.

DETAILED DESCRIPTION

In FIG. 1, an aircraft 1 according to an embodiment of the invention is illustrated. The aircraft 1 comprises a fuselage 3, wings 5 mounted to the fuselage 3, a sensor system 6, and a control unit 7.

Each wing 5 comprises a fixed wing 9, a foldable wing tip portion 11, an actuation unit 13, and an arresting unit 15. The fixed wing 9 extends between a root end 17 and a tip end 19. The foldable wing tip portion 11 is mounted to the tip end 19 of the fixed wing 9 pivotally about an axis of rotation 21 between an extended position and a folded position. In the extended position, the foldable wing tip portion 11 extends in a wing span direction 23 as an extension of the fixed wing 9, wherein in the folded position the foldable wing tip portion 11 is folded away and extends under an angle with respect to the wing span direction 23. The axis of rotation 21 extends in a wing chord direction 25, but in other embodiments might also extend in a wing thickness direction 27.

The actuation unit 13 is configured for actuating movement of the foldable wing tip portion 11 between the extended position and the folded position. The arresting unit 15 is configured for locking the foldable wing tip portion 11 in the extended position and/or in the folded position.

The sensor system 6 comprising a plurality of sensors 6a, 6b, 6c, wherein each sensor 6a, 6b, 6c is configured for detecting an operation parameter related to the operation of the foldable wing tip portion 11.

The control unit 7 comprises a database including a plurality of verified system behavior models with respect to the operation parameters. The system behavior models relate to computer simulations of the target values of the operation parameters including an algorithm calculating the target values of the operation parameter in dependence of other parameters detected by the sensor system 6. The other parameters might be other operation parameters as well as external parameters. The control unit 7 is configured for controlling the aircraft 1 to carry out the following method for operating the aircraft 1:

First, values of the operation parameter are detected by the sensor system 6. Subsequently, the detected values of the operation parameter are compared to the corresponding target values of the operation parameter from the system behavior model by the control unit 7. Upon detection of a predefined deviation of the detected values from the corresponding target values of the operation parameter, a sensor failure or a system failure is detected by the control unit 7.

Upon detection of a sensor failure or a system failure a warning signal is put out by the control unit 7 to a warning display 29 in the cockpit 31 of the aircraft 1. Further, upon detection of a sensor failure the respective sensor 6a, 6b, 6c is deactivated. Upon detection of a system failure the respective system is stopped, is operated in a specific safe mode, or is deactivated, depending on the kind of failure detected and depending on the kind of system involved.

One simple example for an operation parameter would be the time period of an actuation cycle of the actuation unit 13. The time period of the actuation cycle is detected between starting an actuation command and reaching of the desired position, i.e. the extended or folded position. When an actuation command is set up, this is detected by the sensor system 6 and the time period for the actuation cycle is triggered by the control unit 7. At the same time the control unit 7 triggers a computer simulation of the time period for the actuation cycle. The computer simulation includes a system behavior model. The system behavior model might be very simple. In the simplest case it might only include one fixed value. In other cases the system behavior model might include a list of values for different situations, or might include a simple algorithm. However, the system behavior model might also be more complicated, specifically including an algorithm calculating the target value of the operation parameter in dependence of other parameters detected by the sensor system 6. Such other parameters might be other operation parameters, such as the position of the foldable wing tip portion 11, the speed of the foldable wing tip portion 11, the torque applied by the actuation unit 13. However, such other parameters might also be external parameters, such as external loads or temperature. When the foldable wing tip portion has reached the desired extended or folded position, the actuation cycle is completed and the related time period is detected. The detected time period is then compared to the simulated time period, i.e. to the target value of the time period provided or calculated by the system behavior model. If the detected value of the time period deviates from the simulated value by a predefined measure, a sensor failure or a system failure is assigned and subsequently processed by the control unit 7, i.e. safety measure are usually taken.

Another simple example of an operation parameter would be the torque applied by the actuation unit 13. The torque is detected by the sensor system 6 at the actuation unit 13, specifically at a motor of the actuation unit 13. The detected value of the toque is then compared to a target value of the torque provided by a respective system behavior model. In a simple case, the system behavior model calculates the target value of the torque depending on a related external parameter, namely the external torque measured between the foldable wing tip portion 11 and the fixed wing 9 during actuation. In the simplest case the external torque is used as the target value. The value of torque detected at the actuation unit 13 is then compared to the detected value of the external torque, and upon detection of a predefined deviation a failure of the actuator is assumed and thus indicated. Such a procedure represents a simple input-output comparison of the torque and reflects a reliable way of monitoring the operation parameter.

In such a way, proper operation of the foldable wing tip portion can be monitored in a simple and reliable way, and the number of sensors and displays related to the foldable wing tip portion 11 can be reduced.

The invention may be embodied as a method for operating an aircraft (1) comprising a wing (5) with a foldable wing tip portion (11), the method comprising the following steps:

(i) providing an aircraft (1), the aircraft (1) comprising a fuselage (3), wings (5) mounted to the fuselage (3), a sensor system (6), and a control unit (7), wherein the sensor system (6) is configured for detecting an operation parameter related to the operation of the foldable wing tip portion (11), wherein the control unit (7) comprises a system behavior model with respect to the operation parameter, wherein the system behavior model provides a target value of the operation parameter, (ii) detecting a value of the operation parameter by the sensor system (6), (iii) comparing the detected value of the operation parameter to the corresponding target value of the operation parameter from the system behavior model, and (iv) upon a predefined deviation of the detected value from the corresponding target value of the operation parameter, detecting a sensor failure or a system failure While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A method for operating an aircraft including a fuselage, wings mounted to the fuselage, a sensor system, and a control unit, wherein each wing includes a fixed wing and a foldable wing tip portion pivotably mounted to the fixed wing to fold about an axis of rotation between an extended position and a folded position, an actuation unit configured to actuate movement of the foldable wing tip portion between the extended position and the folded position, and an arresting unit configured to lock the foldable wing tip portion in the extended position and/or in the folded position, wherein the sensor system is configured to detect an operation parameter, and the control unit includes a system behavior model with respect to the operation parameter, wherein the system behavior model provides a target value of the operation parameter, and the method comprises:

actuating movement of the foldable wing tip portion towards the extended position or the folded position;

detecting a value of the operation parameter by the sensor system, wherein the operating parameter is related to the operation of the foldable wing tip portion;

comparing the detected value of the operation parameter to a corresponding target value of the operation parameter obtained from the system behavior model, and if a deviation between the detected value and the target value exceeds a predefined deviation, generating a notice of a sensor failure or a system failure.

2. The method according to claim 1, wherein the control unit comprises multiple system behavior models for multiple operation parameters, wherein each of the operation parameters relates to the operation of the foldable wing tip portion.

3. The method according to claim 1, wherein the operation parameter relates to a time period of an actuation cycle of the actuation unit, wherein the actuation cycle includes movement of the wing tip portion between the extended position and the folded position.

4. The method according to claim 3, wherein the time period of the actuation cycle is detected between starting an actuation command and reaching a desired position by the actuation unit.

5. The method according to claim 3, wherein the time period of the actuation cycle is detected between starting an actuation command and locking the foldable wing tip portion in a desired position by the arresting unit.

6. The method according to claim 1, wherein the operation parameter relates to a position of the foldable wing tip portion.

7. The method according to claim 1, wherein the operation parameter relates to a speed movement of the foldable wing tip portion relative to the fixed wing.

8. The method according to claim 1, wherein the operation parameter relates to a torque applied by the actuation unit to move the foldable wing tip portion.

9. The method according to claim 1, wherein the system behavior model includes an algorithm calculating the target value of the operation parameter in dependence on other parameters detected by the sensor system, wherein the other parameters relate to the operation of the wing tip portion.

10. The method according to claim 9, wherein the other parameters include one or more of: a time period of an actuation cycle, a position of the foldable wing tip portion, a speed of the foldable wing tip portion, a torque applied by the actuation unit, an external load and an external temperature.

11. The method according to claim 1, wherein the system behavior model relates to a computer simulation of the target values of the one or more operation parameters during an actuation cycle or during a locking cycle of the wing tip portion, and the computer simulation takes into account one or more of the following operation parameters and external parameters: a time period of an actuation cycle, a position of the foldable wing tip portion, speed of the foldable wing tip portion, torque applied by the actuation unit, an external load and temperature.

12. The method according to claim 1, further comprising issuing a warning in response to the detection of the sensor failure or the system failure.

13. The method according to claim 1, wherein upon the detection of the sensor failure deactivating a corresponding sensor in the sensor system.

14. The method according to claim 1, wherein in response to the detection of the system failure the respective system is stopped, operating a system corresponding to the system failure in a safe mode and/or deactivating the system.

15. An aircraft comprising:

a fuselage;

wings mounted to the fuselage, wherein each wing comprises a fixed wing, a foldable wing tip portion mounted to the fixed wing and configured to pivot about an axis of rotation between an extended position and a folded position;

an actuation unit configured to actuate movement of the foldable wing tip portion between the extended position and the folded position;

an arresting unit configured to lock the foldable wing tip portion in the extended position and/or in the folded position;

a sensor system configured to detect an operation parameter related to the operation of the foldable wing tip portion, and a control unit which comprises a system behavior model with respect to the operation parameter, wherein the system behavior model provides a target value of the operation parameter, and wherein the control unit is configured for:

comparing a detected value of the operation parameter detected by the sensor system to a corresponding target value of the operation parameter from the system behavior model, and upon a predefined deviation of the detected value from the corresponding target value of the operation parameter, detecting a sensor failure or a system failure.

\* \* \* \* \*